United States Patent
Lassig et al.

(10) Patent No.: US 6,875,699 B1
(45) Date of Patent: Apr. 5, 2005

(54) METHOD FOR PATTERNING MULTILEVEL INTERCONNECTS

(75) Inventors: Stephan Lassig, Danville, CA (US); S. M. Reza Sadjadi, Saratoga, CA (US); Vinay Pohray, Fremont, CA (US); Si Yi Li, Milpitas, CA (US); Thomas W. Mountsier, San Jose, CA (US); Chiu Chi, San Jose, CA (US)

(73) Assignees: Lam Research Corporation, Fremont, CA (US); Novellus Sytems, Inc., San Jose, CA (US)

( * ) Notice: Subject to any disclaimer, the term of this patent is extended or adjusted under 35 U.S.C. 154(b) by 109 days.

(21) Appl. No.: 10/138,041

(22) Filed: May 1, 2002

Related U.S. Application Data

(63) Continuation-in-part of application No. 09/990,197, filed on Nov. 21, 2001, and a continuation-in-part of application No. 09/972,765, filed on Oct. 5, 2001, and a continuation-in-part of application No. 09/888,279, filed on Jun. 21, 2001, now abandoned.

(51) Int. Cl.[7] .................................................. H01L 21/302
(52) U.S. Cl. ........................ 438/706; 438/710; 438/712; 438/745; 216/58
(58) Field of Search ............................... 438/706, 710, 438/712, 745, 694, 695; 216/57, 58, 67

(56) References Cited

U.S. PATENT DOCUMENTS

| | | | |
|---|---|---|---|
| 6,051,282 A | | 4/2000 | Konjuh et al. .............. 427/539 |
| 6,057,239 A | * | 5/2000 | Wang et al. ................. 438/689 |
| 6,214,526 B1 | | 4/2001 | Sundararajan et al. ...... 430/316 |
| 6,251,770 B1 | | 6/2001 | Uglow et al. ............... 438/624 |
| 6,537,923 B1 | * | 3/2003 | Bhatt et al. ................. 438/758 |
| 6,613,691 B1 | * | 9/2003 | Hung et al. ................. 438/723 |

OTHER PUBLICATIONS

U.S. Appl. No. 09/972,765, entitled "Trench Etch Process for Low–K Dielectrics", by inventors Li et al., filed Oct. 5, 2001.

U.S. Appl. No. 09/888,279, entitled "Low Dielectric Constant Insulators and Supporting Layers Patterned by Deep Ultraviolet Photolithography", by inventors Mountsier et al., filed Jun. 21, 2001.

U.S. Appl. No. 09/990,197, entitled "Applications and Methods of Making Nitrogen–Free Anti–Reflective Layers for Semiconductor Processing", by inventors Van Schravendijk et al., filed Nov. 21, 2001.

Ogawa et al., article entitled "Practical Resolution Enhancement Effect by New Complete Anti–Reflective Layer in KrF Excimer Laser Lithography", Optical/Laser Microlithography, Session VI, vol. 1927 (1993).

T. Perera, article entitled "AntiReflective Coatings: An Overview", Solid State Technology, vol. 37, No. 7, pp. 131–136 (1995).

* cited by examiner

*Primary Examiner*—Lan Vinh
(74) *Attorney, Agent, or Firm*—Beyer Weaver & Thomas, LLP

(57) ABSTRACT

A method of forming a damascene structure above a substrate is provided. A low-k dielectric layer is formed over the substrate, wherein the low-k dielectric layer does not have a trench stop layer. A plurality of vias are etched through the low-k dielectric layer. Via plugs are formed in the plurality of vias. A plurality of trenches are etched into the low-k dielectric layer, wherein the etching with sufficiently high via plugs minimizes facet formation at the tops of vias exposed to the etch and wherein the trench etch process removes fences caused by the via plugs. The via plugs are stripped.

13 Claims, 15 Drawing Sheets

After trench etch

Stripped after trench etch to show veil (aka fence)

After trench etch, veil removal and strip

Veil Removal Step After Trench Etch
9KÅ initial via plug used to minimize facet

METHOD FOR PATTERNING MULTILEVEL INTERCONNECTS

CROSS-REFERENCE TO RELATED APPLICATIONS

This application is a continuation-in-part of U.S. application Ser. No. 09/972,765, filed on Oct. 5, 2001, entitled "A Trench Etch Process for Low-k Dielectrics", by Li et al., and U.S. application Ser. No. 09/888,279 filed on Jun. 21, 2001, now abandoned entitled "Low Dielectric Constant Insulators And Supporting Layers Patterned By Deep Ultraviolet Photolithography", by Mountsier et al., and U.S. application Ser. No. 09/990,197 filed on Nov. 21, 2001, entitled "Applications And Methods of Making Nitrogen-Free Anti-Reflective Layers", by Van Schravendijk et al., which are all incorporated by reference for all purposes.

BACKGROUND OF THE INVENTION

During semiconductor wafer processing, features of the semiconductor device are defied in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

The etching of dielectrics may be advantageously accomplished in a dual-frequency confined, (DFC) dielectric etch system. One such is Lam® Research model Exelan HP™, available from Lam® Research Corporation, Fremont Calif. The Exelan HP™ system provides an extremely comprehensive dielectric etch portfolio in one system. Processes include contacts and vias, bi-level contacts, borderless contacts, nitride and oxide spacers, passivation, and dual damascene etch processes.

In semiconductor-based device (e.g., integrated circuits or flat panel displays) manufacturing, dual damascene structures may be used in conjunction with copper conductor material to reduce the RC delays associated with signal propagation in aluminum-based materials used in previous generation technologies. In dual damascene, instead of etching the conductor material, vias, and trenches may be etched into the dielectric material and filled with copper.

To facilitate discussion, FIG. 1A is a cross-sectional view of a stack 100 on a wafer 110 used in the dual damascene process of the prior art. A contact 104 may be placed in a dielectric layer 108 over a wafer 110. A barrier layer 112, which may be of silicon nitride or silicon carbide, may be placed over the contact 104 to prevent the copper diffusion. A via level silicon oxide dielectric layer 116 may be placed over the barrier layer 112. A trench stop layer 120 (silicon carbide or silicon nitride) may be placed over via level dielectric 116. A trench level silicon oxide dielectric layer 124 may be placed over the trench stop layer 120. An antireflective layer (ARL) 128 may be placed over the trench dielectric layer 124. A patterned resist layer 132 may be placed over the ARL 128. The ARL 128 may be formed from silicon nitride, SiON, or other material with a high refractive index and high extinction coefficient.

FIG. 2 is a high level flow chart of a process used in the prior art to form the stack 100 into a dual damascene structure. The stack 100 may be subjected to an etch, which etches a via 140 down to the barrier layer 112 (step 204). The etching of the via 140 may form a crust 144, which forms sidewalls. The crust 144 and resist 132 may be removed and subsequently repatterned with a new resist layer 160, which is patterned to form a trench (step 208), as shown in FIG. 1C. The stack may be subjected to an etch, which etches a trench 164 down to the intermediate trench etch stop layer 120 (step 212), as shown in FIG. 1D. The etching of the trench 164 may cause part of the via level dielectric layer 116 to facet 172. This faceting may be considered as damage to the dual damascene structure. The intermediate trench etch stop layer 120 may be used to reduce faceting. The etching of the trench 164 may also form a new crust 168, which forms sidewalls. The resist layer 160 and crust may then be stripped (step 216). The stack 100 may then be subjected to a barrier layer etch (step 220), which opens the via 140 to the copper contact 104, to provide the structure shown in FIG. 1E. A metal barrier layer 174 may be deposited over the copper contact (step 224), as shown in FIG. 1F. A copper seed layer 176 may then be used to coat the interior of the via and trench. Electroplating may be used to fill the trench and via with copper 178, which is polished down to the trench dielectric layer 124. The copper 178 may be used as a copper connect for the next level, so the process is repeated creating multiple levels of copper connects and dielectric layers.

Although the intermediate trench etch stop layer may be used to reduce faceting, providing and etching the intermediate trench etch stop layer requires additional processing steps, which increases processing time and costs.

In addition, integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. A number of promising materials, which are sometimes referred to as "low-k materials", have been developed. In the in specification and claims, low-k materials are defined as materials with a dielectric constant k that is less than 4. Fluorosilicate glass is one example of a low-k dielectric, which has a dielectric constant of about 3.7. This composes an about 7–9% fluorine doped into $SiO_2$.

Another interesting class of low-k materials is compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the density, and hence the dielectric constant of the material. A dielectric constant for such films is typically <3.0.

To facilitate discussion, FIG. 3A is a cross-sectional view of part of a wafer in the production of a damascene structure without a trench stop layer and using a low-k dielectric. A contact 304 may be placed in a low-k dielectric layer 308 over a wafer 310. A second contact 306 may also be in the low-k dielectric layer 308. A dielectric barrier layer 312, typically, but not limited to, silicon nitride or silicon carbide, may be placed over the contact 304 to prevent copper diffusion. A low-k dielectric layer 320 may be placed over the barrier layer 312. An antireflective layer (ARL) 328 may be placed over the low-k dielectric layer 320. A patterned resist layer 332 may be placed over the ARL 328. The patterned resist layer 332 is patterned to provide a via 340, which is etched into the low-k dielectric layer 320. The resist layer 332 is removed and a second patterned resist layer 360 is placed over the ARL 328. The second resist layer 360 is patterned to provide a trench 364, which is etched into the low-k dielectric layer 320. So FIG. 1A is a view just before via etch and FIG. 1B is a view just after via etch, while FIG. 3A is a view after via etch and strip.

Because of the absence of the intermediate trench etch stop layer and the use of a low-k dielectric, faceting 372 in this example may be increased. Such faceting may cause the copper, which would be used to fill in the via and trench, to be too close to the second contact 306. This may also increase the dimension of the bottom of the via.

To facilitate understanding, FIG. 4A is a cross-sectional view of part of a wafer in the production of a damascene structure without a trench stop layer and using in a low-k dielectric. A first contact 404 and a second contact 406 may be placed in a low-k dielectric layer 408 over a wafer 410. A dielectric barrier layer 412, typically, but not limited to silicon nitride or silicon carbide, may be placed over the first and second contacts 404, 406 to prevent the copper diffusion. A low-k dielectric layer 420 may be placed over the barrier layer 412. First 440 and second 444 vias may be etched into the low-k dielectric layer 420. A bottom antireflective coating (BARC) layer 428 may be spun over the low-k dielectric layer 420. Such a spun on BARC tends to at least partially fill the vias 440, 444 and form sidewalls in the vias. Generally, thinner vias are filled with BARC to a higher depth than wider vias are filled. Also, more spread apart vias may be filled higher than more closely packed vias. As a result, it may be difficult to have the vias filled to a uniform height.

FIG. 4B is a cross-sectional view of part of the wafer after trenches 448, 452 have been etched. The presence of BARC in the vias creates fences 456, 460 and, in addition, faceting 462, 464. The amount of faceting and the size of the fences are dependent on the height of the BARC. Therefore, non-uniform BARC height may cause non-uniform faceting and fences. The fences may be a stress location, which may cause electro-migration, voids and other failures, which may diminish the reliability of the resulting semiconductor devices.

In addition, the desired pattern after the development step is not always realized. More specifically, silicon dioxide ($SiO_2$) historically has been used as the primary interconnect insulating layer. With device geometries shrinking and speeds increasing, the trend now is towards insulating materials with lower dielectric constants (low-k). One of the most persistent difficulties associated with the integration of the low-k film has been its interaction with photoresists used with deep UV radiation ("DUV", i.e., radiation having a wavelength of 248 nm and below). Low-k films often contain a small amount of nitrogen, present in the form of $NH_x$(amines). The $NH_x$ species can diffuse rapidly through low-k dielectric films. Such groups are known to react in a detrimental fashion with DUV photoresists by neutralizing the photo-acid catalyst. The result is footing or bridging of the printed to features. These footings narrow the opening in the photoresist which results in poor pattern transfer to the underlying layers.

To alleviate this phenomenon, a cap layer could be incorporated on top of the low-k film. This approach is very costly and is limited to cap layers that are barriers to the diffusion of amines (i.e., low-k cap layers may not be suitable.) Moreover, the use of a cap layer will be effective only for single layer lithography; e.g., printing vias for via-first dual damascene, or trenches in the case of trench-first. However, after formation of those features into the dielectric, DUV resist would once again come in contact with low-k film during the next pass through lithography. The result would be regions of undeveloped resist in the second pass lithography features, for example, in the case of via-first patterning, the appearance of "mushrooms" or "rivet heads" over the vias (also filled with resist) in the trench regions.

Organic layers have been commonly used as ARLs for I-line radiation (i.e., radiation having a wavelength of 365 nm), although inorganic layers can also be used. Layers of inorganic materials, such as silicon oxynitride, are often used for deep UV radiation. For a discussion of the use of deep UV ARLs, see T. Ogawa et al., "Practical Resolution Enhancement Effect by New Complete Anti-Reflective Layer in KrF Excimer Laser Lithography", Optical/Laser Microlithography, Session VI, Vol. 1927 (1993), incorporated herein by reference. For a general discussion of the use of ARLs, see T. Perara, "Anti-Reflective Coatings: An Overview", Solid State Technology, Vol. 37, No. 7, pp. 131–136 (1995), which is incorporated herein by reference.

There is a need for a simpler approach to deposit an ARL with elimination of the photoresist footing problem and photoresist poisoning (mushroom) problem in dual damascene processes. Such poisoning is further described and illustrated in U.S. application Ser. No. 09/888,279 filed on Jun. 21, 2001, entitled "Low Dielectric Constant Insulators And Supporting Layers Patterned By Deep Ultraviolet Photolithography", by Mountsier et al., which is incorporated by reference. It would be desirable for the ARL to be optically and thermally stable, to be chemically inert to the environments to which it is exposed, and to be applicable for use with any wavelength of UV radiation. In addition, the ARL should have good adhesion to commonly used materials and have good mechanical and structural integrity. Finally, it would be desirable to provide a single continuous process for producing the ARL with acceptable uniformity across the wafer.

The present invention relates to the fabrication of semiconductor-based devices. More particularly, the present invention relates to improved techniques for fabricating semiconductor-based devices with dual damascene structures.

SUMMARY OF THE INVENTION

To achieve the foregoing and in accordance with the purpose of the present invention, a method of forming a damascene structure above a substrate is provided. A low-k dielectric layer is formed over the substrate, wherein the low-k dielectric layer does not have an intermediate trench stop layer. A plurality of vias is etched through the low-k dielectric layer. Via plugs are formed in the plurality of vias. A plurality of trenches are etched into the low-k dielectric layer, wherein the etching with sufficiently high via plugs minimizes facet formation at the tops of vias exposed the etch and wherein the trench etch process removes fences caused by the via plugs. The via plugs are stripped.

In another embodiment the invention provides a method of forming a damascene structure in a low-k dielectric layer. A plurality of vias are etched in the low-k dielectric layer. Via plugs are formed in the plurality of vias. A poison free trench pattern is provided over the low-k dielectric layer which has a plurality of vias previously etched. A plurality of trenches are etched into the low-k dielectric layer, wherein the etching removes fences caused by the via plugs and minimizes faceting. The via plugs are then stripped.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
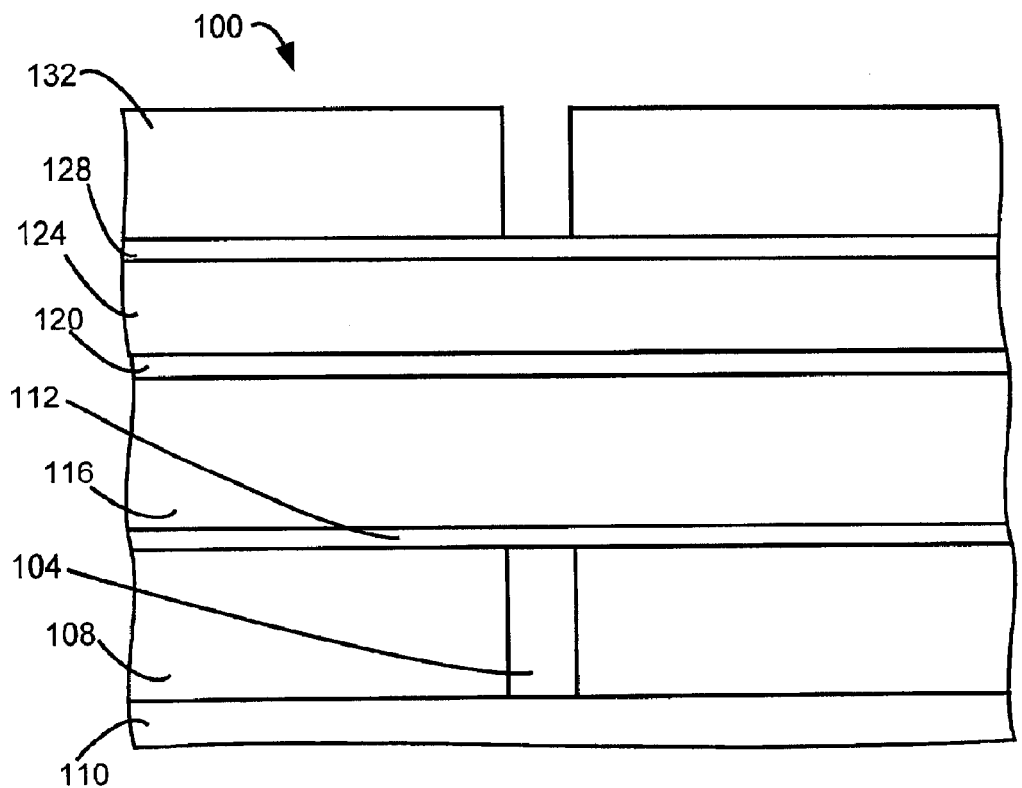
FIGS. 1A–F are schematic views of the formation of a damascene structure in the prior art.
Figure 1B:
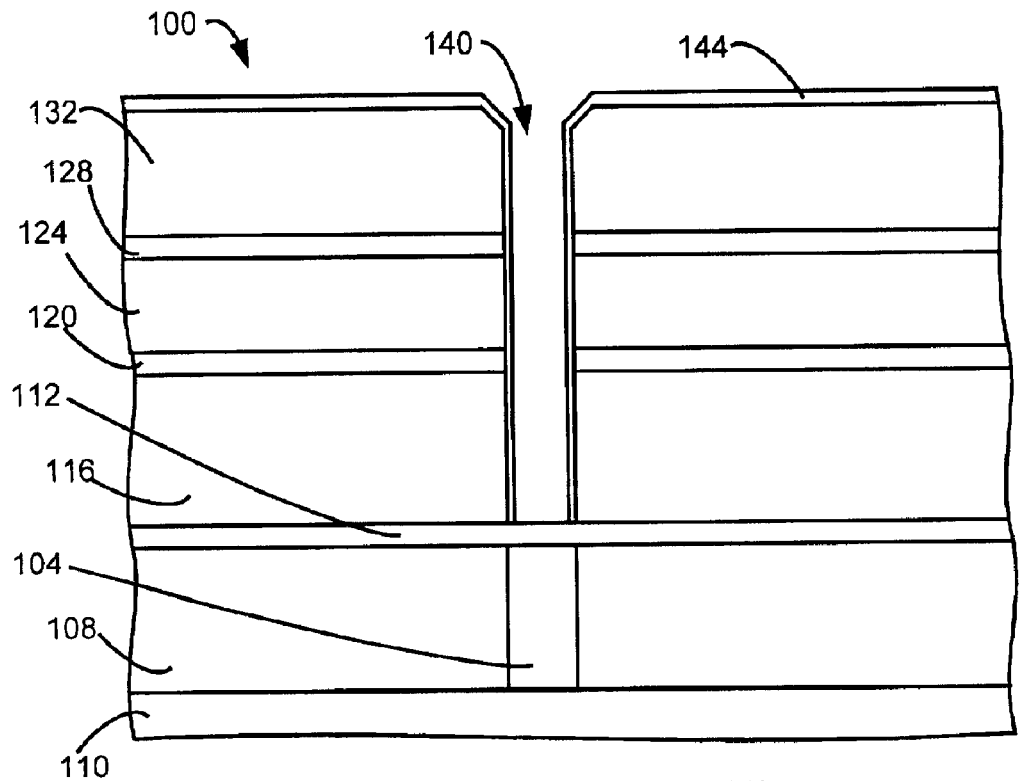
Figure 1C:
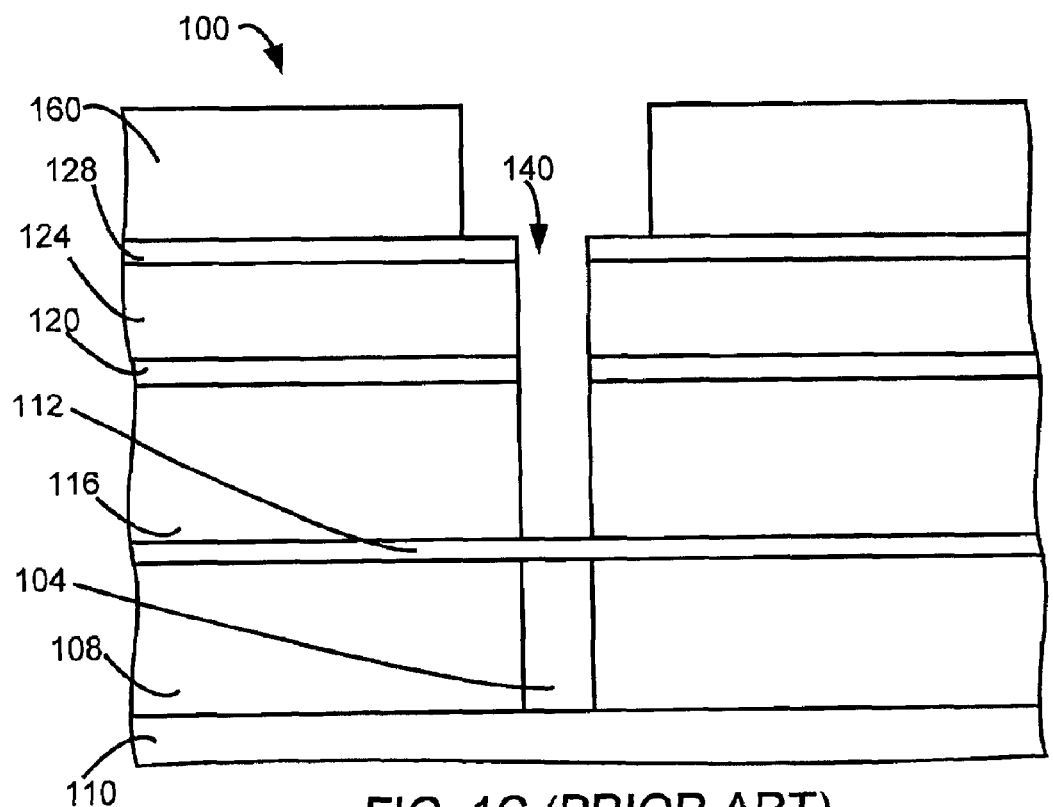
Figure 1D:
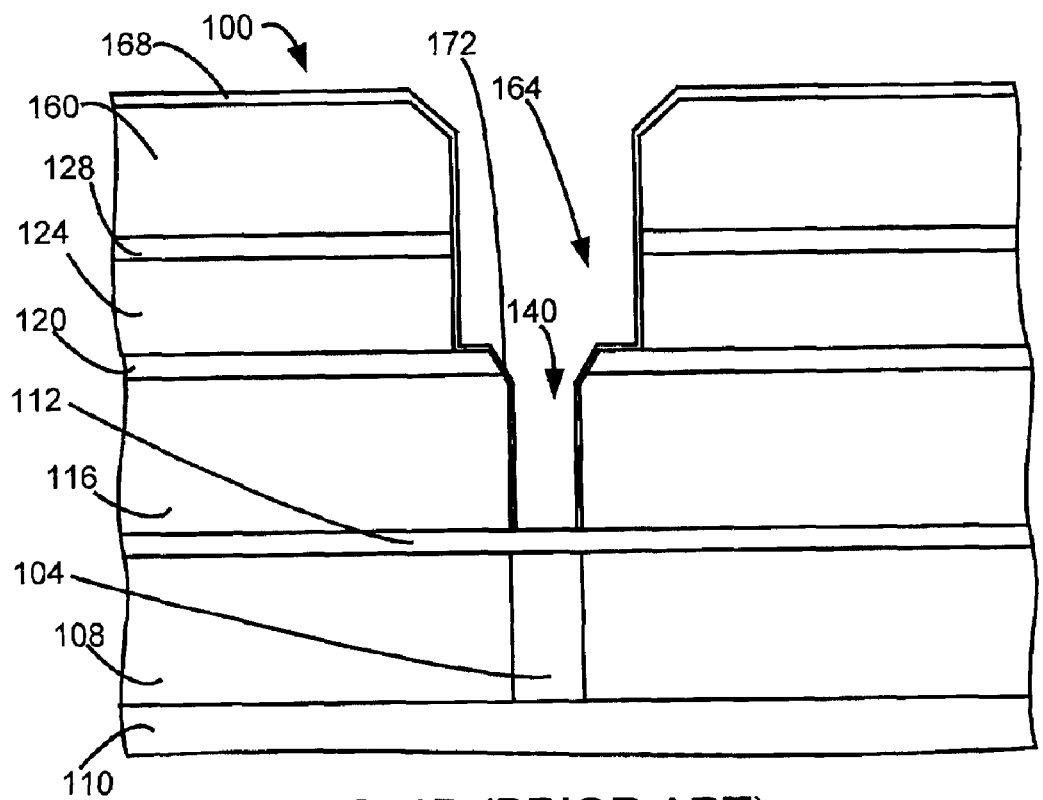
Figure 1E:
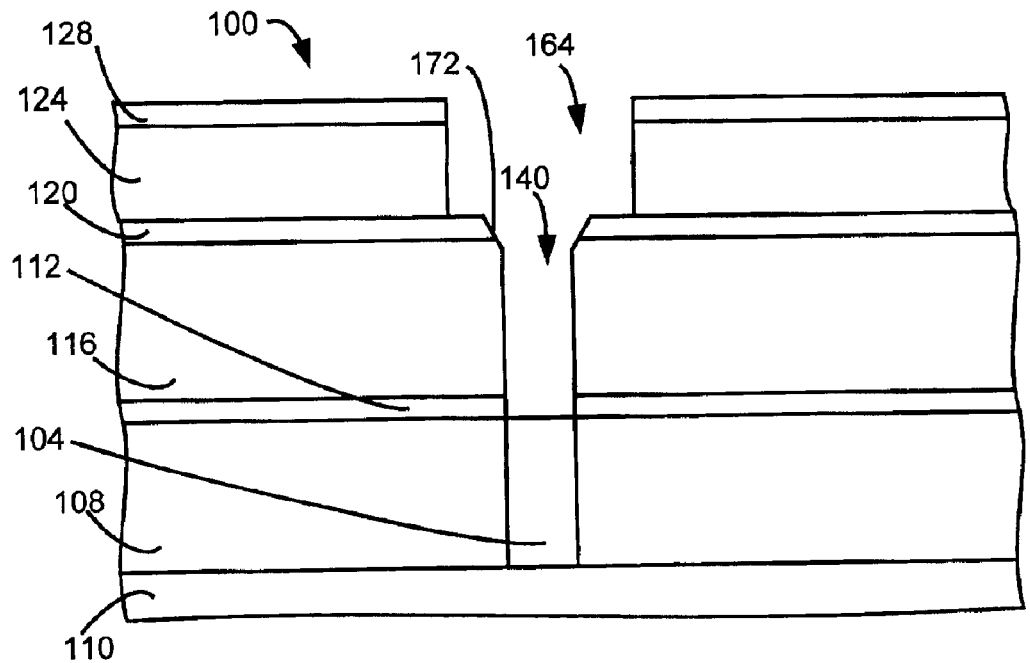
Figure 1F:
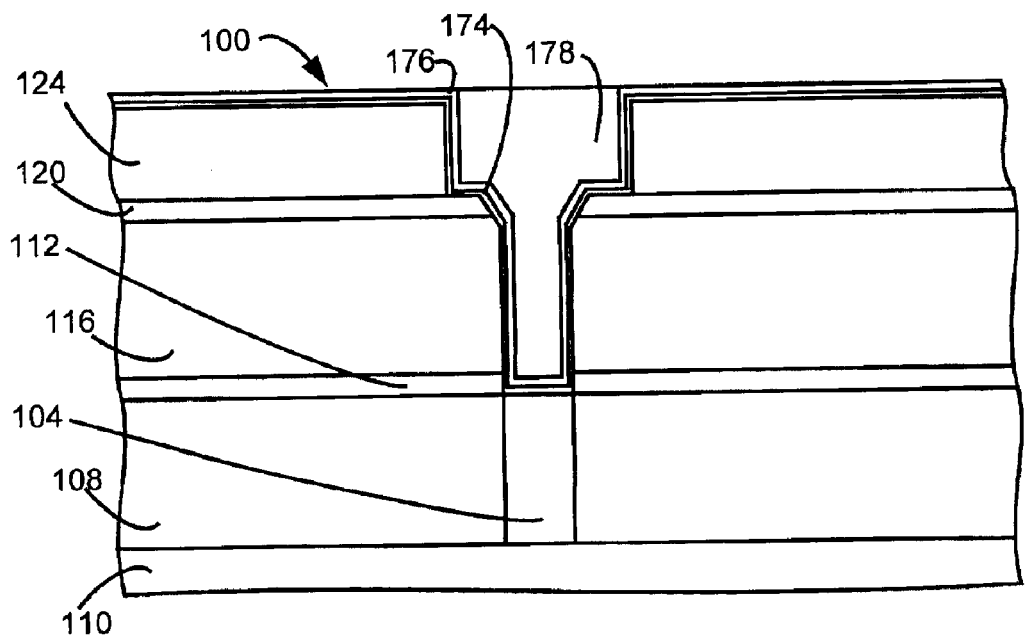
Figure 2:
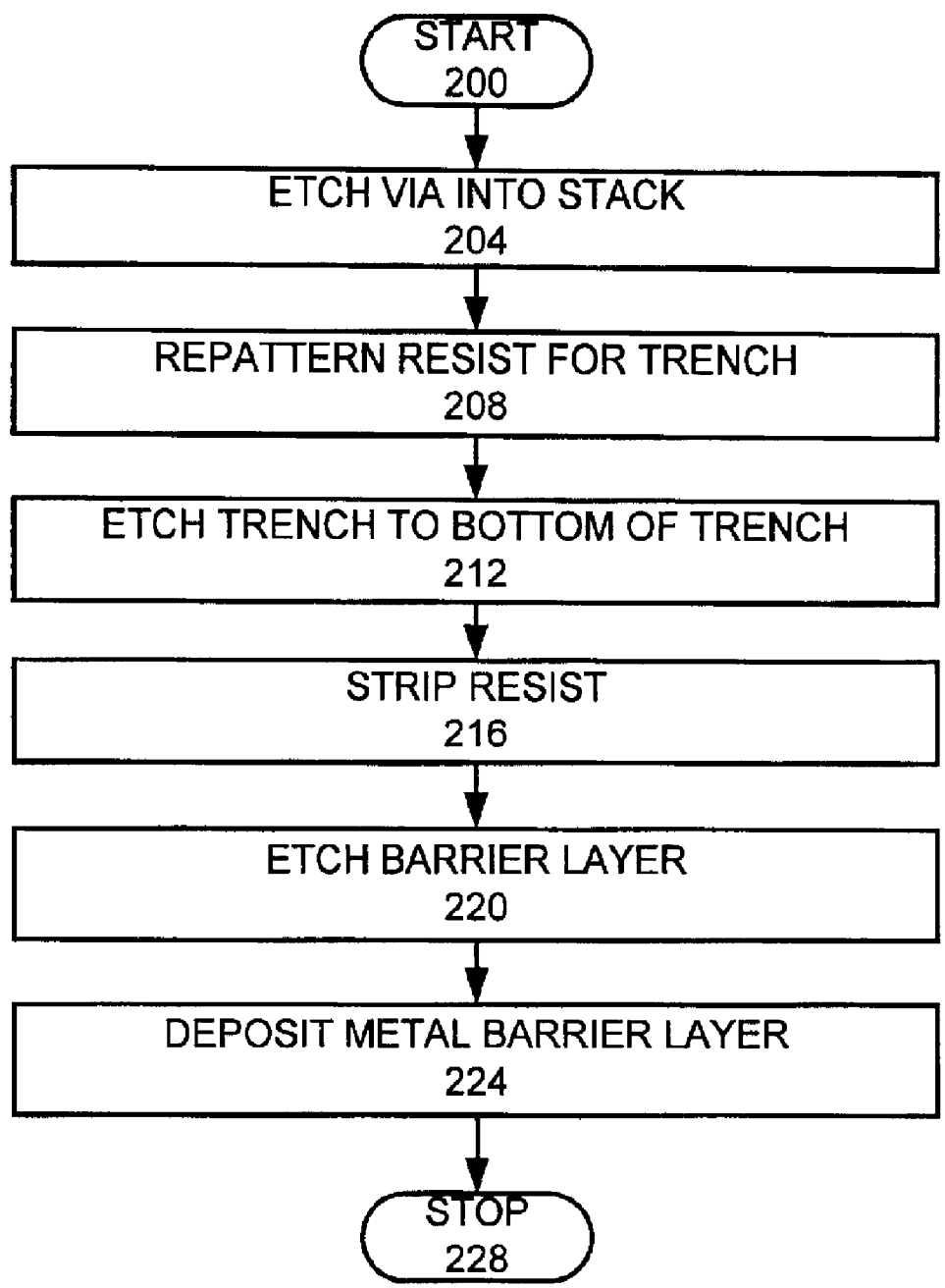
FIG. 2 is part of a flow chart of the formation of the damascene structure shown in FIGS. 1A–F.
Figure 3A:
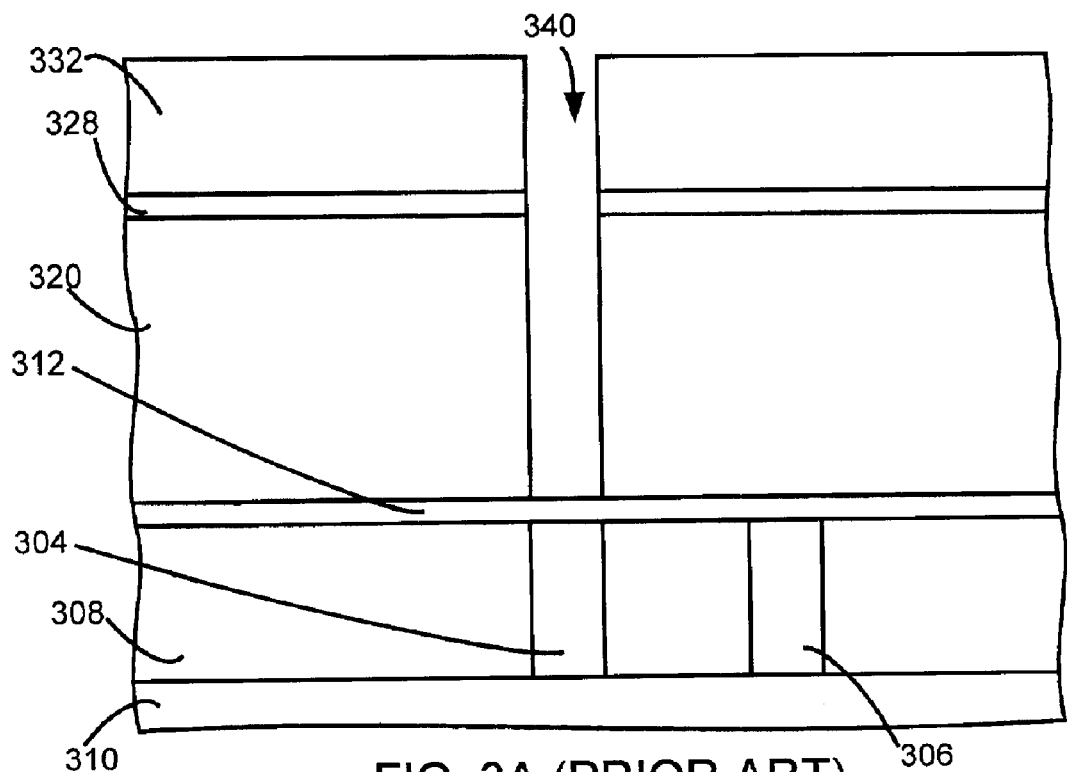
FIGS. 3A–B are schematic views of the formation of a damascene structure using another method in the prior art.
Figure 3B:
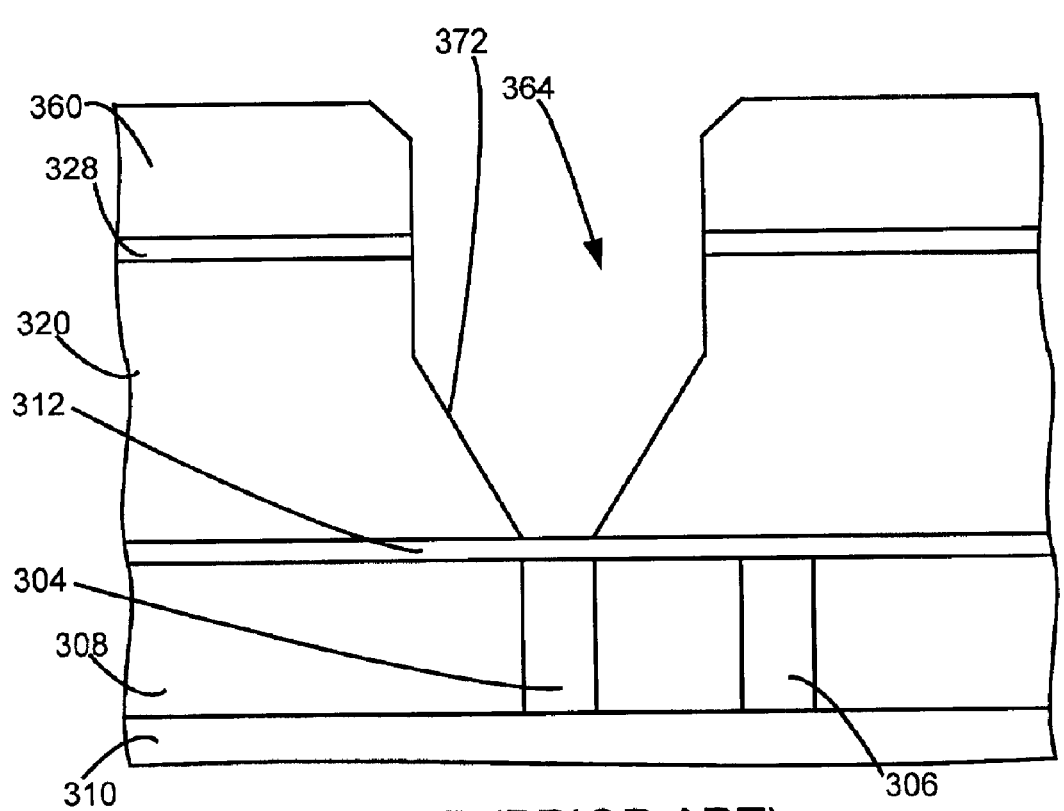
Figure 4A:
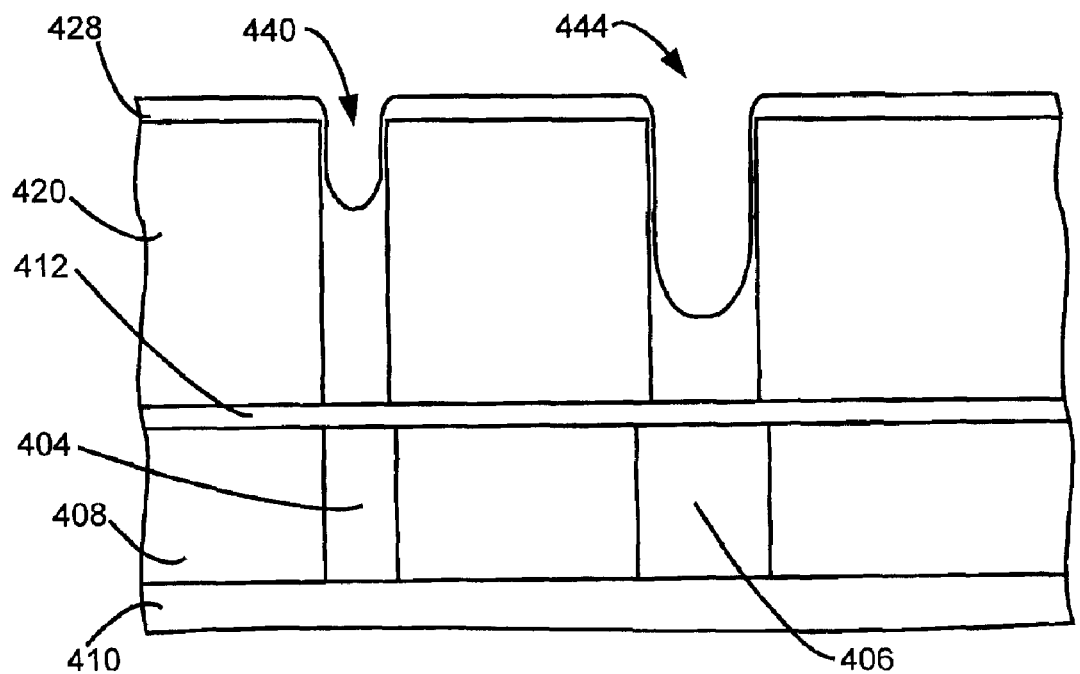
FIGS. 4A–B are schematic views of the formation of a damascene structure using another method in the prior art.
Figure 4B:
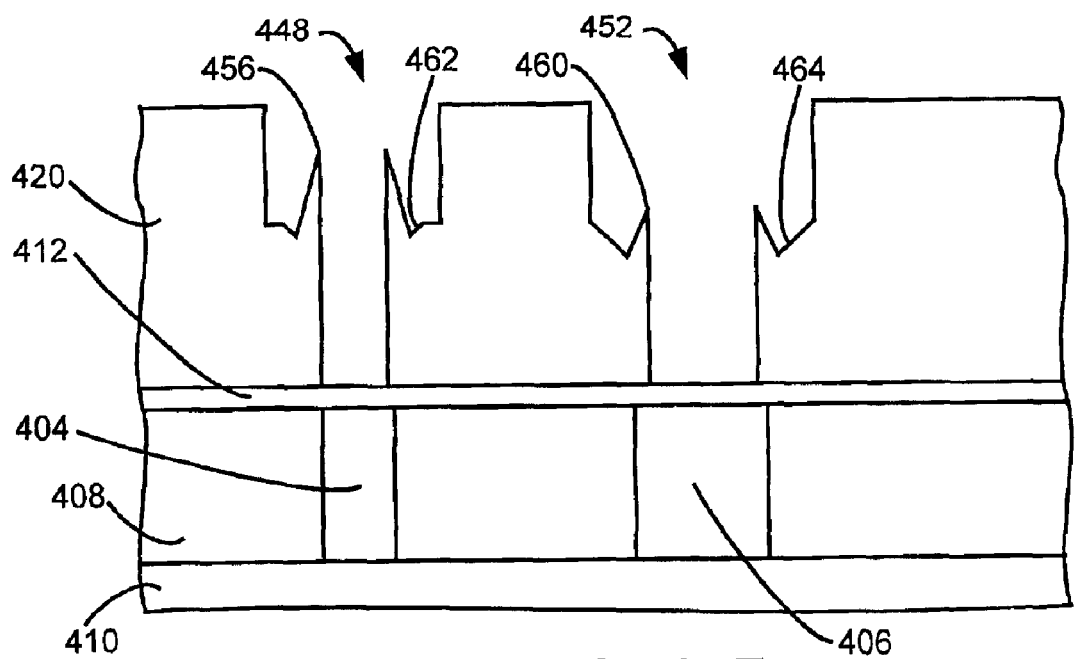
Figure 5:
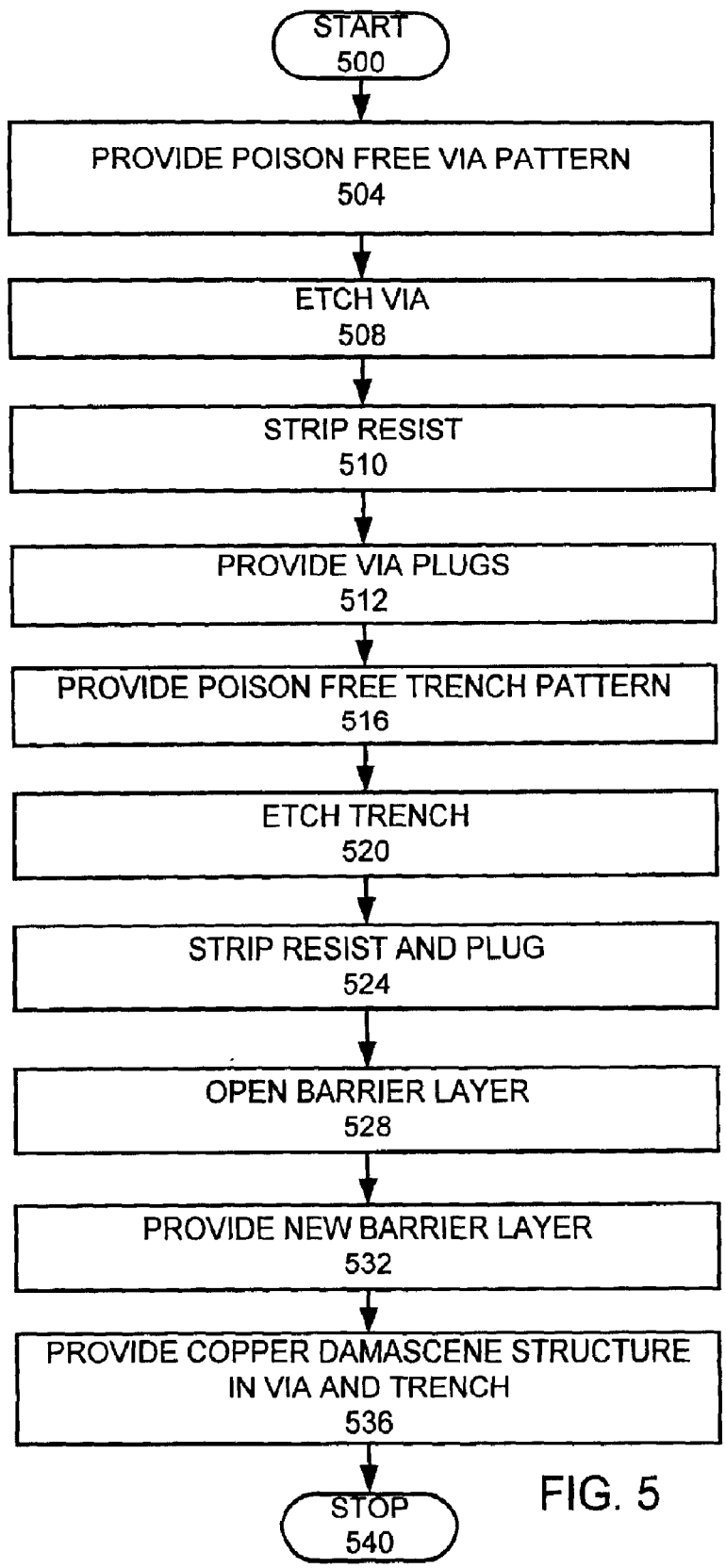
FIG. 5 is a flow chart of a process used in an embodiment of the invention.
Figure 6A:
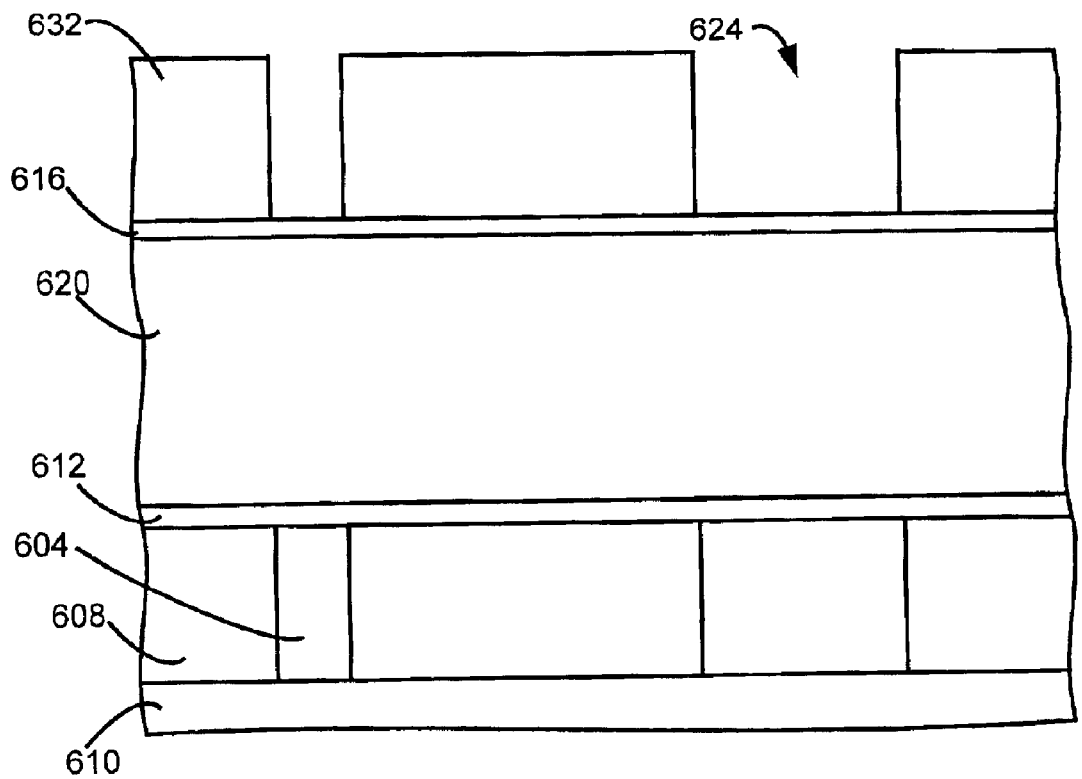
FIGS. 6A–H are schematic views of the formation of a damascene structure using the process shown in FIG. 5.
Figure 7:
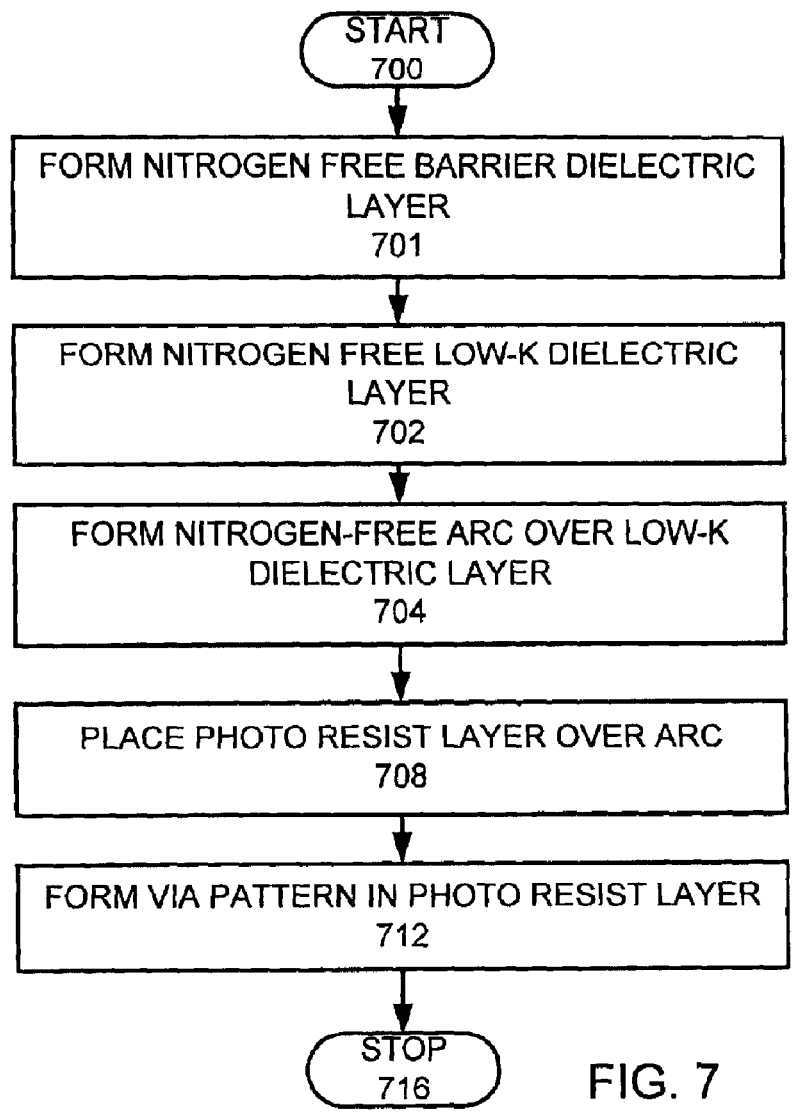
FIG. 7 is a flow chart of a via patterning step.

To facilitate understanding, FIG. 5 is a high level flow chart of a process used in an embodiment of the invention. A poison free via pattern is provided (step 504). A poison free via pattern is a via pattern free of defects caused by poisoning from in-film contamination that neutralizes the photo-acid catalyst in the photoresist. FIG. 7 is a more detailed flow chart of one embodiment of providing a poison free via pattern. To provide the poison free via pattern, a dielectric barrier layer (step 701) and a low-k dielectric layer (step 702) are formed over a contact. The dielectric barrier layer and the low-k dielectric layer may be nitrogen free. Such nitrogen free low-k dielectric layers are described in U.S. patent application Ser. No. 09/888,279, filed Jun. 21, 2001, entitled "Low Dielectric Constant Insulators And Supporting Layers Patterned By Deep Ultraviolet Photolithography", by Thomas W. Mountsier et al., which is incorporated by reference for all purposes. Such a dielectric layer may be formed from an amorphous silicon carbide containing hydrogen material prepared by plasma assisted chemical vapor deposition. Source gases for this material include but are not limited to silanes, methane, and hydrocarbon substituted silanes, such as methylsilane, dimethylsilane, trimethylsilane, tetramethylsilane, and phenyltrimethylsilane. Background gases including but not limited to carbon dioxide, argon, and helium can be included in the gas mixture. FIG. 6A is a cross-sectional view of a nitrogen free low k dielectric layer 620 formed over a barrier layer 612, which is formed over another dielectric layer 608 with electrical contacts 604, which are formed over a wafer 610. Although the dielectric layer 608 is shown as being formed on the wafer 610, there may be any number of dielectric layers formed between the low k dielectric layer 620 and the wafer 610. In addition, the dielectric layer 608 and contacts 604 may have been previously formed using the present invention, so that the dielectric layer 608 may be a low k dielectric layer and the contacts 604 are part of a damascene structure. A barrier layer 612 may be formed over the dielectric layer 608 and contacts 604 to prevent copper from diffusing into a dielectric layer and causing copper poisoning. The barrier layer 612 may be a silicon carbide (SiC) layer. The low-k dielectric may be organosilicate dielectrics, including CORAL™ from Novellus of San Jose, Calif.; Black Diamond™ from Applied Materials of Santa Clara, Calif.; Auroras™ available from ASM International N.V., The Netherlands; Sumika Film® available from Sumitomo Chemical America, Inc., Santa Clara, Calif., and HOSP™ from Allied Signal of Morristown, N.J., as discussed above.

A nitrogen-free ARL 616 may then be formed over the low-k dielectric layer 620 (step 704). The formation of the nitrogen-free ARL by chemical vapor deposition (CVD) is described in U.S. patent application Ser. No. 09/990,197, filed Nov. 21, 2001, entitled "Applications and Methods of Making Nitrogen-Free Anti-Reflective Layers for Semiconductor Process, by Van Schravenkijk et al. and incorporated by reference for all purposes.

In one embodiment, the ARL is produced from silicon, oxygen, hydrogen, and carbon-containing source gases or liquids, optionally with one or more inert gases, in a CVD system.

Preferred sources of silicon include silane, organosilicate compounds, for example, tetraethylorthosilicate (TEOS) or tetramethylorthosilicate (TMOS), or an organosilane, such as, tetramethylsilane or a phenylsilane. Fluorinated reactants, such as silicon tetrarfluoride, may be used although fluorine is generally a less desirable film component. Organic groups on the organosilicate or organosilane precursors can be aromatic or aliphatic. Alternatively, mixtures of the aforementioned compounds, or mixed compounds, in which some organic substituents are bonded to silicon through an oxygen linkage and others are attached directly to silicon, such as alkylalkoxysilanes, are used as silicon precursors.

Suitable oxygen-containing source gases and liquids include any source gas that contains oxygen and does not contain nitrogen. For example, suitable sources of oxygen include carbon dioxide, carbon monoxide, methanol, water, and the like. Elemental oxygen gas (usually in pure form) can also be used if TEOS is used as the silicon source.

The silicon and/or the oxygen source can also provide a source of carbon. Alternatively, a separate carbon source, such as methane, can be used in producing the ARL. Again, virtually any carbon source can be used provided that it does not contain nitrogen.

Generally, the silicon, oxygen, and/or the carbon source will also serve as a source of hydrogen. Alternatively, a separate hydrogen source, such as hydrogen gas, may be used in producing the ARL.

According to some embodiments, a non-reactive carrier gas is also used during deposition. Suitable inert gases include the Noble gases, such as neon, helium, and argon.

ARL composition and properties can be varied by modifying the gas flow rate, deposition pressure, deposition temperature, and RF power level. Generally, however, increasing oxygen content in the film will result in a more transparent ARL; whereas, increasing carbon and/or silicon content will produce a less transparent ARL.

Atomic concentrations of a representative nitrogen-free ARL of the present invention are: 2 to 20% hydrogen; 30 to 70% silicon; and 20 to 80% oxygen. For convenience, the amounts of each ingredient are stated as round numbers. However, one skilled in the art will recognize that amounts within 10 or 20 percent of the stated values can also be expected to be appropriate, i.e., where 20% is stated, a range of from 16 to 18% to 22 to 24% is implicit and can be appropriate.

In accordance with this invention, the ARL will contain nitrogen below the detectable limit as measured using Secondary Ion Mass Spectrometry analysis (SIMS), and generally, will be about one ppm or less. Although, preferably, the ARL will contain no nitrogen, it will be appreciated that nitrogen may be present in the film to the extent that the release of $NH_x$ during or after deposition does not neutralize the photoacid catalyst or otherwise cause footing or mushrooming as described above.

In accordance with certain embodiments of this invention, the nitrogen-free ARL has an extinction coefficient ("k") of from about 0 to about 1.3 at 248 nm, and more preferably, of about 0 to about 0.8; and a refractive index ("n") of about 1.5 to about 3.0 and more preferably, of about 1.6 to about 2.2. (When the wavelength decreases, e.g., to 193 nm and beyond, the corresponding refractive index of a nitrogen-free ARL will decrease and the extinction coefficient will increase.) The ARL will have a thickness of between about 100 and 5000 Angstroms.

The nitrogen-free ARL of the invention are thermally and optically stable to the conditions typically used in semiconductor manufacturing; thus, the parameters of n, k, and t will not vary significantly throughout the semiconductor manufacturing process. The present invention can be used to produce ARLs for use with radiation having a wavelength within the UV range, including wavelengths of 365 nm, 248 nm, 193 nm and beyond.

Chemical vapor deposition (CVD), plasma-enhanced chemical vapor deposition (PECVD), high density plasma chemical vapor deposition (HDP-CVD), or other similar processes can be used to produce the ARL. See, e.g., U.S. Pat. Nos. 6,051,282, 6,251,770, 6,214,526, each of which is incorporated herein by reference. The film can be deposited in a single wafer reactor, multistation sequential deposition systems, or batch reactor.

The first step in the formation of an ARL of the invention is to place a substrate, typically a silicon wafer, on a pedestal in a CVD reactor. The total gas pressure in the CVD reactor chamber is typically between 0.1 mTorr and 100 Torr and is dependent on the type of deposition (e.g., PECVD or HDP-CVD), and more preferably, at about 3 Torr for PECVD depositions. The substrate temperature is typically in the range from about 200° C. to 500° C. or even upwards of 900° C. for front-end processes. While maintaining the substrate temperature and the reactor pressure below 100 Torr, process gas is introduced into the reactor. The process gas reacts on the surface of the substrate, thereby depositing the anti-reflective layer.

Generally, the process gas is a gas mixture comprising silicon, oxygen, hydrogen, and/or carbon-containing gases. In a preferred embodiment, using silane and carbon dioxide as the source gases, the ratio of carbon dioxide to silane will typically be between about 5:1 and 100:1, and more preferably from about 25:1 to 75:1. Flow rates of the gases will vary according to the reactant and film properties desired. More specifically, carbon dioxide can be introduced at a rate of from 2.5 sccm/cm$^2$ to 25 sccm/cm$^2$, preferably about 5 sccm/cm$^2$; and silane, at a rate of from about 0.01 sccm/cm$^2$ to about 0.5 sccm cm$^2$, preferably about 0.06 to about 0.13 sccm/cm$^2$, and most preferably, at about 0.085 sccm/cm$^2$. All flow rates given above are based on per square centimeter of the wafer surface area.

The CVD process may be plasma enhanced. The process gas is ionized to enhance the deposition of the ARL, for example, to increase the deposition rate. In plasma-enhanced CVD, a radio frequency power is applied to sustain a plasma discharge for depositing a nitrogen-free ARL with desired properties and will vary depending on total flow. The radio frequency power is applied at a rate of from 0.5 W/cm$^2$ to 5.5 W/cm$^2$, preferably about 0.27 W/cm$^2$. In addition, a dual frequency PECVD system with both high and low frequency radio frequency power supplies can be used. The low frequency radio frequency power can be applied at a rate of from 0.05 to 1 W/cm$^2$.

The method of this invention is particularly useful in conjunction with a multiple-station CVD unit, such as the Concept One, Concept One MAXUS™, Concept Two SEQUEL Express™, Concept Two Dual SEQUEL Express™, Concept Three SEQUEL™, and VECTOR™ System plasma-enhanced chemical vapor deposition (PECVD) units; or the Concept Two SPEED™, Concept Two SPEED/SEQUEL™, or Concept Three SPEED™ high-density plasma (HDP) CVD units, each of which is manufactured by Novellus Systems, Inc. of San Jose, Calif. In such multi-station units, the anti-reflective layer is preferably deposited as a series of sublayers, each of which is formed at a different processing station.

A photoresist layer 632 is formed over the ARL 616 (step 708). The photoresist layer may be patterned by exposing the photoresist layer 632 to a patterned light and then developing the photoresist layer 632 to obtain a via aperture 624 in the photoresist layer 632. The nitrogen-free ARL, barrier and low-k dielectric layers eliminate in-flim sources of amine ($NH_x$) contamination, which can lead to DUV photoresist poisoning. Other methods separately or in combination may be used to provide the poison free via pattern.

Figure 6B:
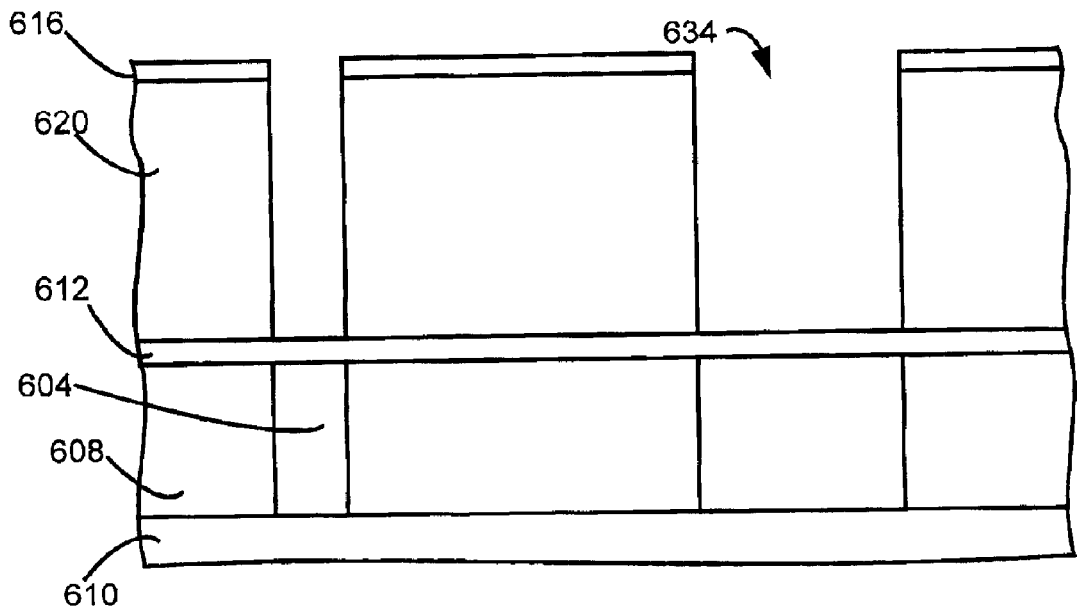
Figure 6C:
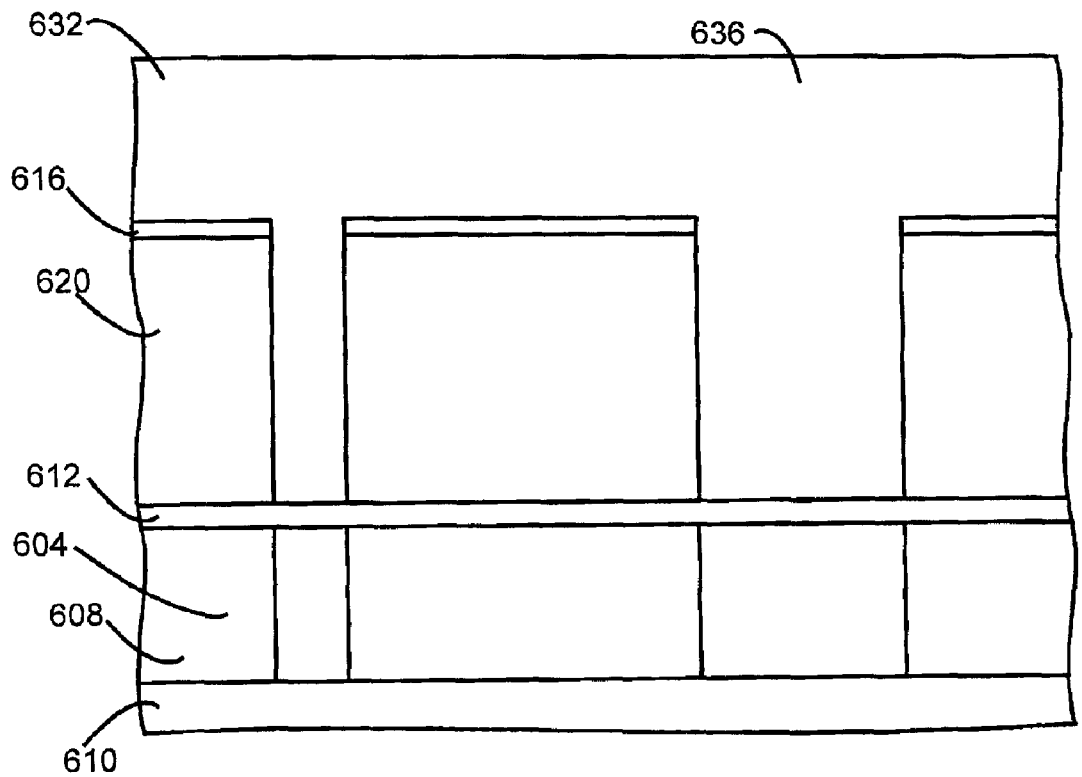
Figure 8:
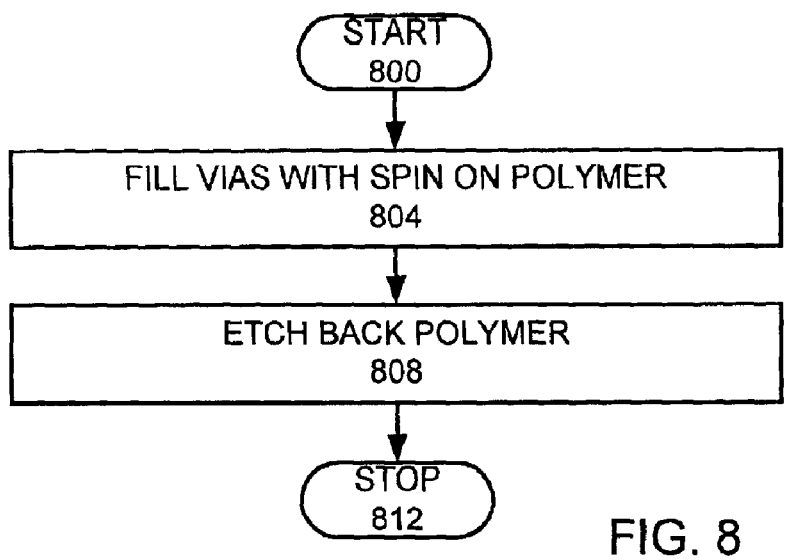
FIG. 8 is a flow chart of a via plug forming step.

A via 634 is then etched through the low-k dielectric layer (step 508), as shown in FIG. 6B. The via etching may be performed in an Exelan HP™, available from Lam® Research Corporation, Fremont Calif., using an argon, $C_4F_8$, and nitrogen-etching chemistry. The resist layer is then stripped (step 510). The stripping may be done in the etching chamber, in a separate plasma stripping device, or as a wet strip. Via plugs are then provided (step 512). FIG. 8 is a more detailed flow chart of one embodiment of the step of providing via plugs. A polymer 636 is spun-on to fill the vias, as shown in FIG. 6C (step 804). Heat may be used to cause the polymer to flow and fill the vias. For it to meet desired planarity, the film may be more than 200 nm thick. The polymer may be a polymer known as I-line photoresist. In the preferred embodiment, the I-line photoresist is baked to destroy the photoactivity of the photoresist.

Figure 6D:
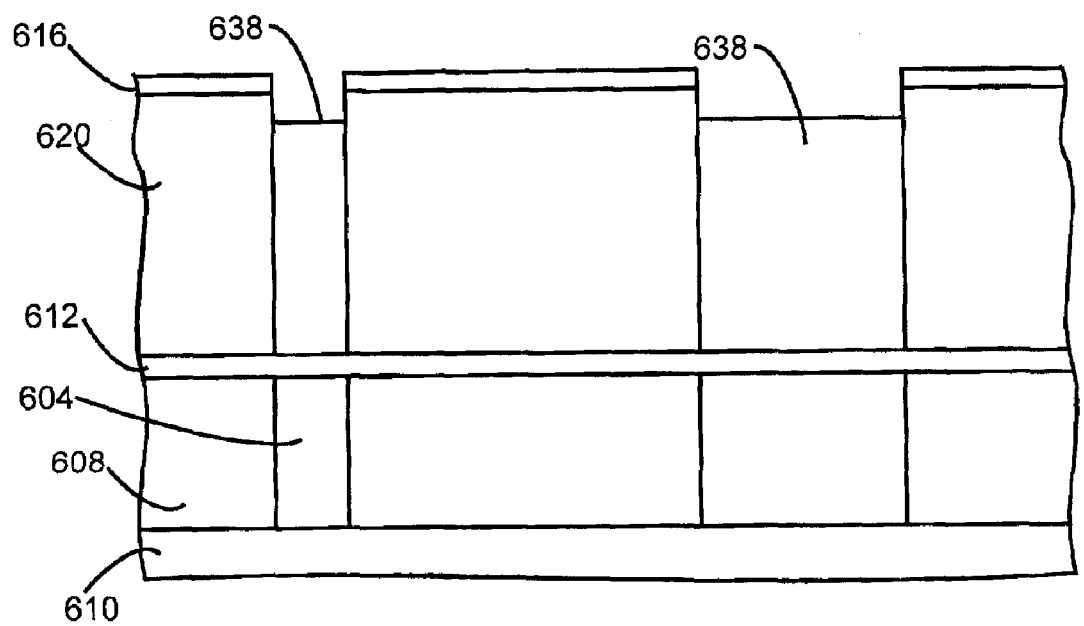

Other easily etchable organic material that may be spun on to fill the vias and provide an even surface may be used in place of the I-line photoresist. Such organic materials are preferably polymers that fill the vias without voids or cracks and can be etched back, and yet have some etch resistance to minimize faceting, and yet are also able to be subsequently removed. I-line photoresist is convenient since many fabrication facilities are plumbed to provide I-line photoresist. The polymer 636 is etched back so that the vias are filled to substantially the same depth (step 808), as shown in FIG. 6D. The etch back may be performed by conventional etching methods or by chemical-mechanical polishing (CMP). An etch back may use $H_2$, $O_2$, $N_2$, $CO_2$, or CO as etchant gases. Inert gases such as argon or helium can be included. As a result, all vias may be uniformly filled to substantially the same regardless of via width and density. The via plugs should be at least above the height of the bottom of the desired trenches. The resulting via plugs may fill the vias from 50 to 100%. More specifically, the via plugs may fill the vias from 75 to 100%. More specifically, the via plugs may fill the vias from 90 to 100%. Since in this example the ARL is deposited by CVD, the ARL may be able to survive the stripping process and may be able to be used for both via patterning and trench patterning, so that a separate ARL may not need to be applied for trench patterning.

Figure 6E:
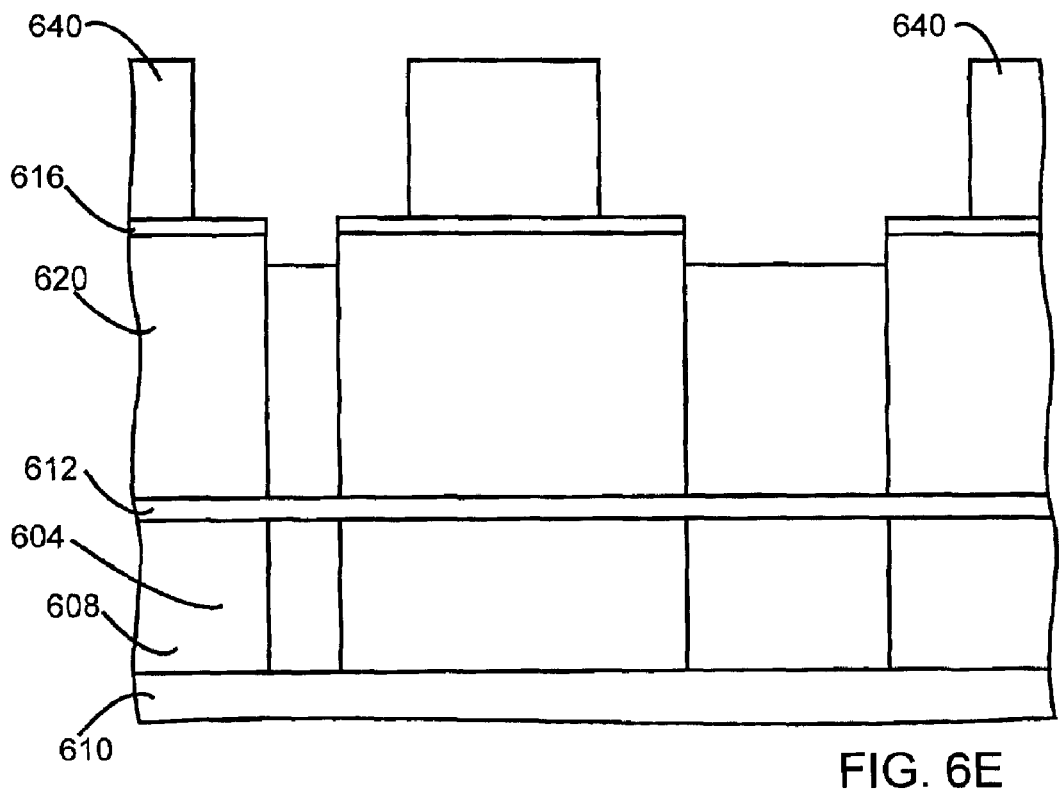
Figure 9:
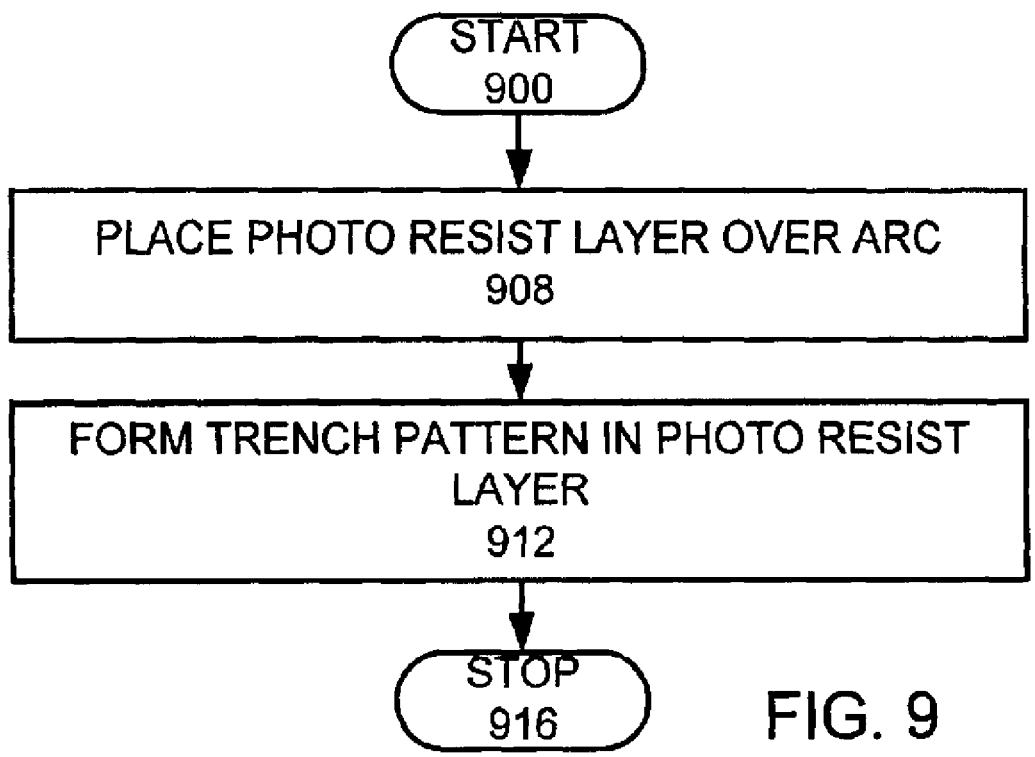
FIG. 9 is a flow chart of a trench patterning step.

A poison free trench pattern is then provided (step 516). FIG. 9 is a more detailed flow chart of the step of providing the poison free trench pattern. A photoresist layer is placed over the ARL (step 908). The photoresist layer is patterned (step 912) to form a trench-patterned photoresist layer 640, as shown in FIG. 6E. The nitrogen free ARL, barrier dielectric and low-k dielectric help to provide the poison free trench pattern. Other methods may be used to provide the poison free trench pattern.

Figure 6F:
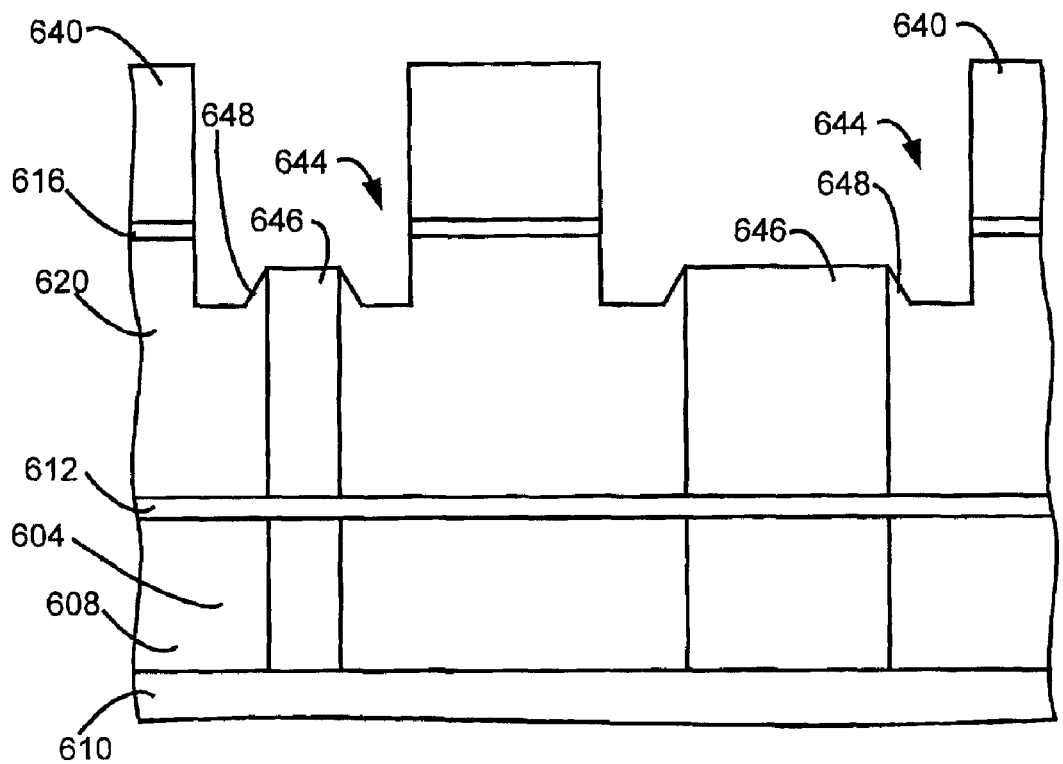
Figure 10:
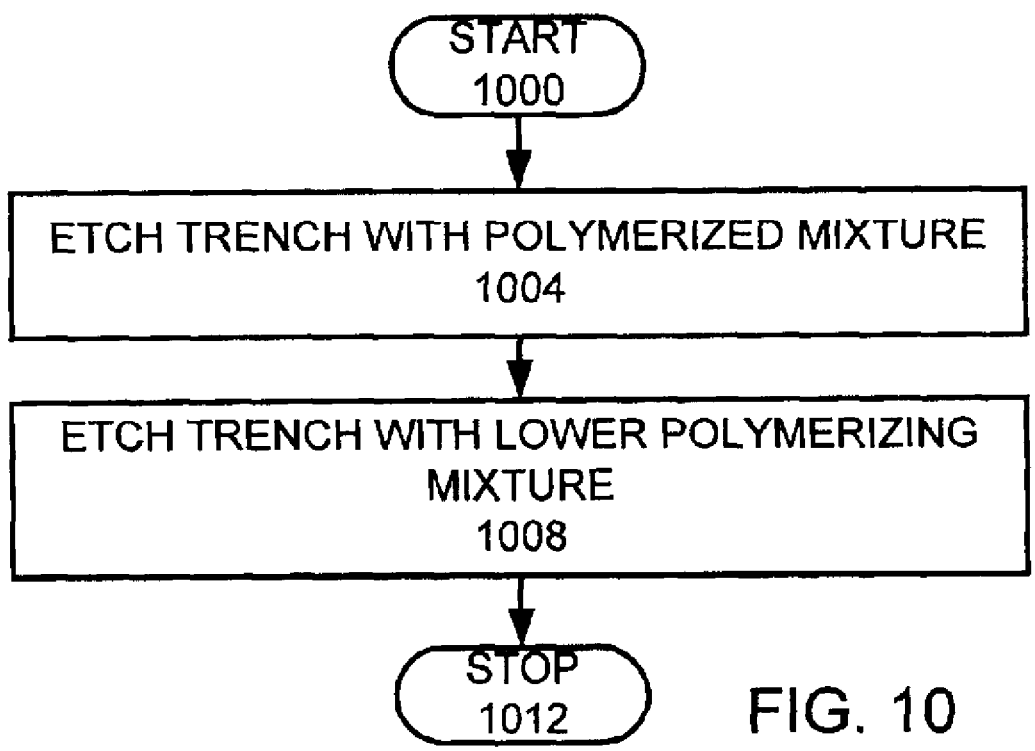
FIG. 10 is a flow chart of a trench etching step.

The trenches are then etched (step 520). One method of etching the trench is described in U.S. patent application Ser. No. 09/972,765, filed Oct. 5, 2001, entitled "A Trench Etch Process for Low-k Dielectrics", by Li, SiYi et al., which is incorporated by reference for all purposes. FIG. 10 is a more detailed flow chart of the step of etching the trench. A first etchant with a polymerized mixture is used to etch the trench. The polymerized gas mixture is specific to the minimizing the etching of the photoresist. Additionally, the polymerized gas is configured to generate a polymer film to protect the trench sidewalls. By way of example and not of limitation, the polymerized gas mixture includes: hydrofluorocarbon gases such as $CHF_3$ and $CH_2F_2$; or fluorocarbon gases such as $C_4F_8$, $C_4F_6$, and $CF_4$. The polymerized gas mixture deposits a polymer film. Preferably, during the anisotropic etch process, the polymer film is cleared from the trench bottom and adheres to the sidewalls. It shall be appreciated by those skilled in the art, having the benefit of this disclosure, that there are various well-known methods for achieving the balance of providing a polymerized gas mixture that performs both anisotropic trench etching and generates a polymerized film that is deposited on the sidewalls. Additionally, the inventors postulate that the polymerized gas mixture promotes polymerization on the fence which prevents the fence from being removed. In operation, after the polymerized gas mixture is applied to the low-k dielectric, a portion of the trench 644 is etched, as shown in FIG. 6F. The desired trench depth is not achieved with the application of the fist gas mixture. Preferably, the plugs 646 remain in the vias and may not be etched. A fence-type formation 648 surrounds the perimeter of the via and the plugs 646. The via plugs 646 minimize the formation of facets, when the via plugs sufficiently fill the vias.

Figure 6G:
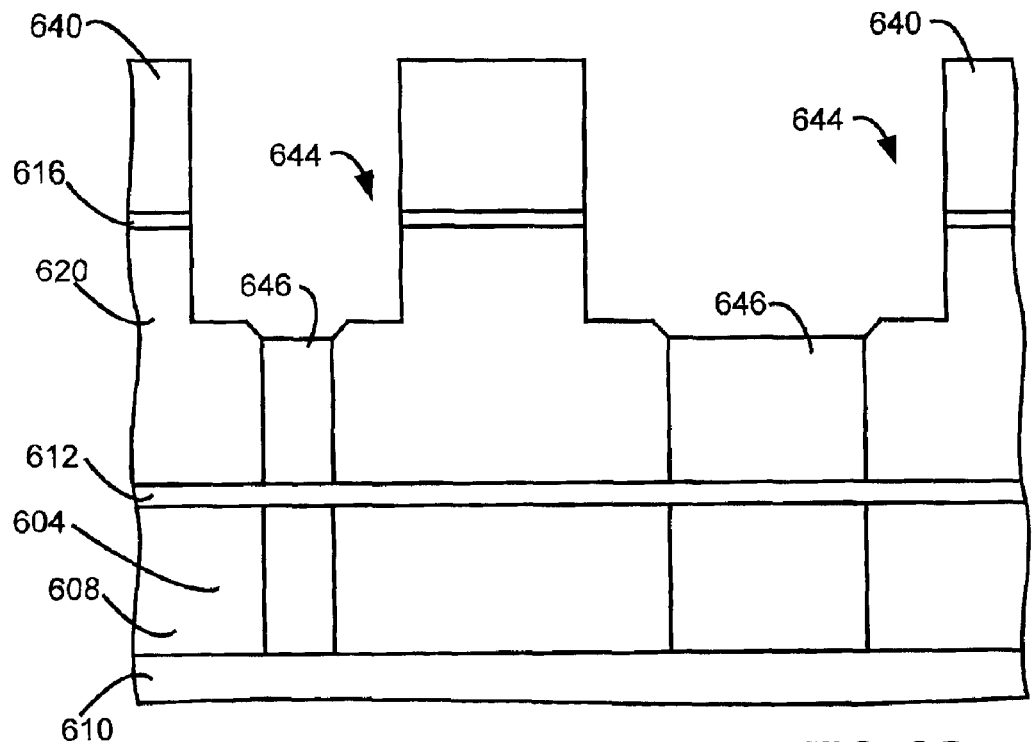

The flow of the polymerized mixture is stopped, and the trench is etched with a lower polymerizing mixture (which may be a non-polymerized mixture) (step 1008). The lower polymerizing mixture continues to etch the trench 644 and etches away the fence formation and part of the via plug 646. The inventors postulate that a lower or non-polymerized gas is needed to etch the fence formation. By way of example and not of limitation, a non-polymerized gas may be $NF_3$, $N_2$ and a reducing gas $H_2$, or may be a gas mixture of $NF_3$, $N_2$, and an oxidizing gas $O_2$. Other gas mixtures that have little or no polymer precursors include $CF_4$ and $CHF_3$. Gas mixtures which include $CH_2F_2$ and $CH_3F$ are not recommended, because they may produce polymer film on the fence formation, however, the application of these gases may be controlled with an $O_2$ mixture. A lower polymerizing gas generally has a lower concentration of polymer than the polymerized mixture. This method of etching provides for trenches without fences, providing trenches 644 with a relatively flat bottom, as shown in FIG. 6G.

Figure 6H:
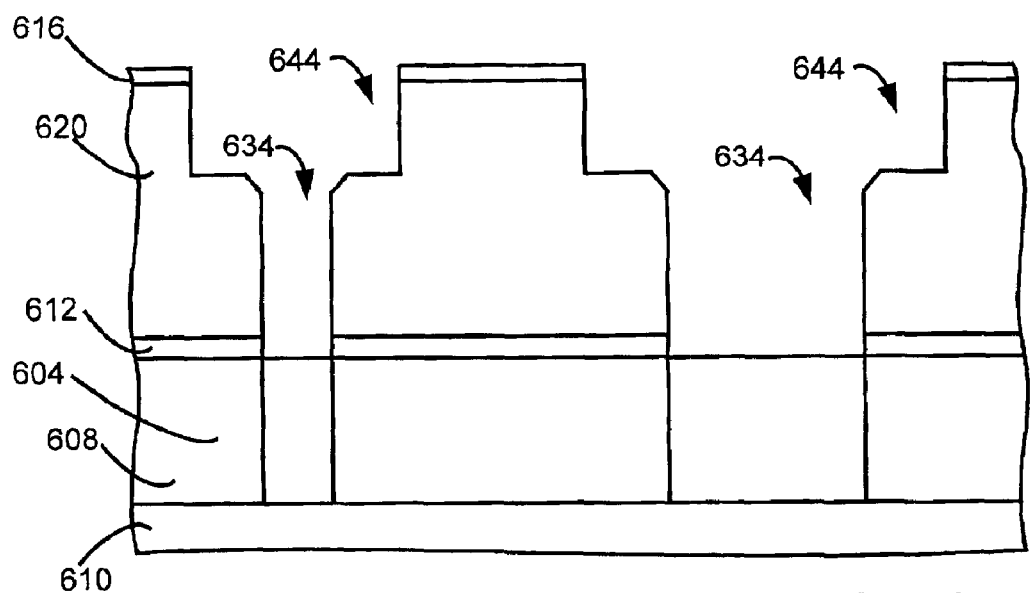

The remaining photoresist 640 and via plug 646 may be stripped (step 524) using an oxygen strip, as shown in FIG. 6H. It has been found that, by increasing the strip time, an oxygen plasma strip is able to strip the remaining photoresist and via plug leaving a small amount of residue, which may be cleaned up using a wet chemistry. Other strip chemistries may be used.

Next, a part of the barrier layer 612 over the contacts 604 is opened (step 528). This may be done in a single step by performing a nitrogen/hydrogen ($N_2/H_2$) etch with a carbon tetrafluoride ($CF_4$) additive. The amount of $CF_4$ additive may range from 1–25 sccm. More specifically, the amount of $CF_4$ additive may range from 2–10 sccm. More specifically, the amount of $CF_4$ may be about 5 sccm. The $CF_4$ additive may be provided to two liters per minute of other gases such as nitrogen and hydrogen. Such barrier etching may provide minimal faceting, cause minimal CD enlargement, and create minimal residue, as shown in FIG. 6H. It has been found that the above process may be able to provide a final shift in the dielectric constant of the sidewall OSG of less than 0.2.

A new metal barrier layer may be placed in the damascene structure to provide a copper barrier (step 532). Copper may then be provided to fill the damascene structure, forming a copper contact (step 536).

Figure 11:
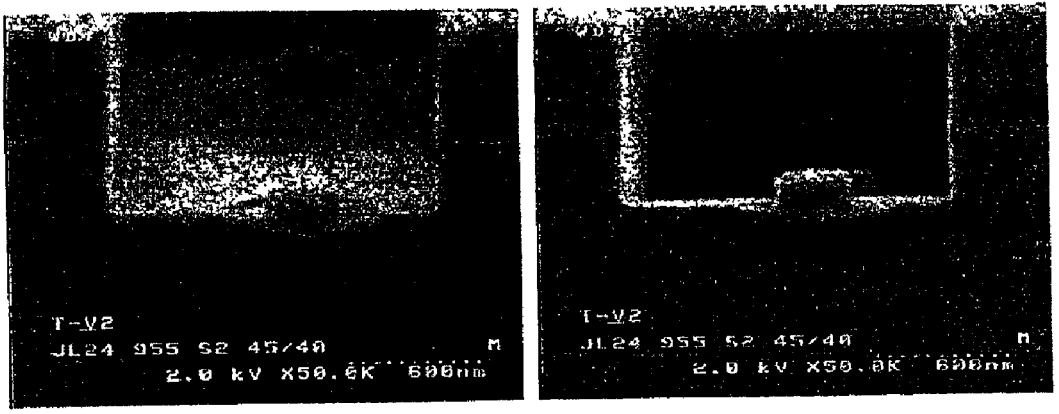
FIG. 11 is an SEM of vias formed by an embodiment of the invention.
Figure 11:
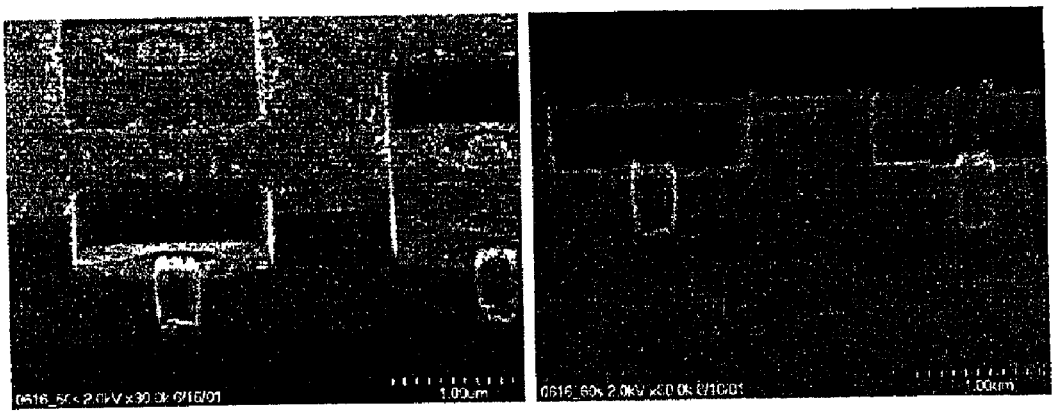
Figure 11:
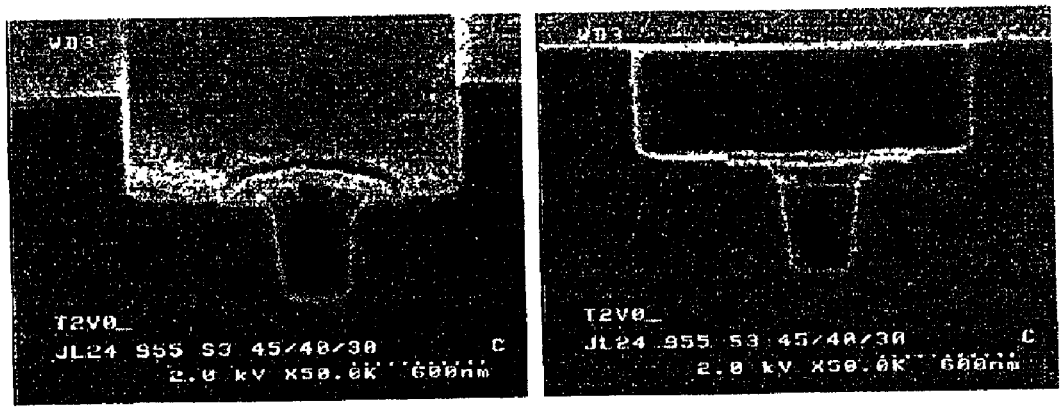

FIG. 11 is SEM images of a DUV lithography in an OSG dielectric without a trench stop layer.

Figure 12:
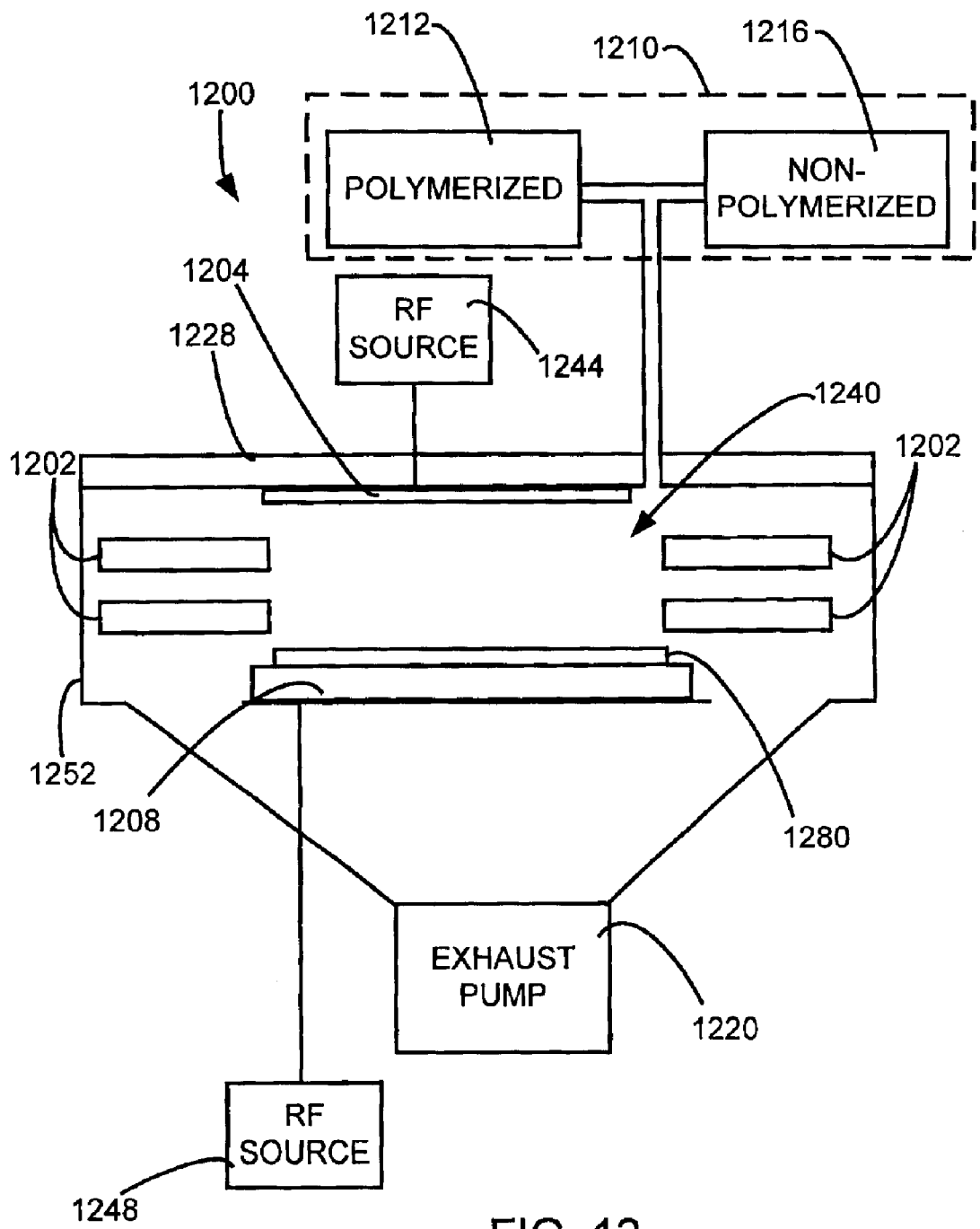
FIG. 12 is a schematic view of a plasma processing chamber that may be used for etching and stripping.

FIG. 12 is a schematic view of a plasma processing chamber 1200 that may be used for etching and stripping. The plasma processing chamber 1200 comprises confinement rings 1202, an upper electrode 1204, a lower electrode 1208, a gas source 1210, and an exhaust pump 1220. The gas source 1210 comprises a polymerized etching gas source 1212 and a non-polymerized etching gas source 1216. The gas source 1210 may comprise additional gas sources, such as a photoresist stripping gas source and a different via etching gas source. Within plasma processing chamber 1200, the wafer 1280 is positioned upon the lower electrode 1208. The lower electrode 1208 incorporates a suitable substrate chucking mechanism (e.g., electrostatic, mechanical clamping, or the like) for holding the wafer 1280. The reactor top 1228 incorporates the upper electrode 1204 disposed immediately opposite the lower electrode 1208. The upper electrode 1204, lower electrode 1208, and confinement rings 1202 define the confined plasma volume. Gas is supplied to the confined plasma volume by gas source 1210 and is exhausted from the confined plasma volume through the confinement rings 1202 and an exhaust port by the exhaust pump 1220. A first RF source 1244 is electrically connected to the upper electrode 1204. A second RF source 1248 is electrically connected to the lower electrode 1208. Chamber walls 1252 surround the confinement rings 1202, the upper electrode 1204, and the lower electrode 1208. Both the first RF source 1244 and the second RF sources 1248 may comprise a 27 MHz power source and a 2 MHz power source. Different combinations of connecting RF power to the electrode are possible. In the case of Exelan HP made by LAM Research Corporation™ of Fremont, Calif., that may be used in a preferred embodiment of the invention, both the RF sources are connected to the lower electrode, and the upper electrode is grounded.

In another embodiment, a silicon dioxide (SiO) cap layer may be used in place of a CVD ARL, as the ARL.

In another embodiment, instead of using a CVD ARL, a spun-on organic bottom anti-reflective coating (BARC) may be used for via patterning. Such a BARC may be removed during resist stripping. A new layer of BARC may be used to fill the vias and then be etched back to create via plugs and an anti-reflective coating layer. In another embodiment, a spin-on BARC may be used to created the via plugs in a process that provides a remaining top surface of less than 200 nm. so that a subsequent etch back or CMP of the BARC is not needed.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of forming a damascene structure above a substrate, comprising the steps of:
   forming a low-k dielectric layer over the substrate, wherein the low-k dielectric layer does not have an intermediate trench etch stop layer;
   etching a plurality of vias through the low-k dielectric layer;
   forming via plugs in the plurality of vias;
   forming a poison free trench pattern,
   etching a plurality of trenches into the low-k dielectric layer, wherein the etching removes fences caused by the via plugs, wherein the etching the plurality of trenches, comprises:
      etching with a first etchant gas which comprises a polymerized mixture to form fence formations around the via plugs; and
      etching with a second etchant gas subsequent to etching with the first etchant gas, wherein the second etchant gas comprises a lower polymerizing mixture, which etches away the fence formations; and
   stripping the via plugs.

2. The method, as recited in claim 1, wherein the via plugs have a height of 75% to 100% of a height of the vias.

3. The method, as recited in claim 1, wherein the stripping the via plugs also strips the patterned trench photoresist layer.

4. The method, as recited in claim 1, wherein the stripping is done in the same chamber as the etching.

5. The method, as recited in claim 1, wherein faceting is minimized.

6. The method, as recited in claim 1, wherein the forming the poison free trench pattern, comprises forming a nitrogen-free anti-reflective layer.

7. The method, as recited in claim 6, wherein the nitrogen-free anti-reflective layer is a nitrogen free chemical vapor deposition anti-reflective layer.

8. The method, as recited in claim 6, wherein the nitrogen-free anti-reflective layer is a silicon dioxide cap layer.

9. The method, as recited in claim 6, wherein the nitrogen-free anti-reflective layer is a bottom anti-reflective coating, and wherein the via plugs are formed by a bottom anti-reflective layer.

10. The method, as recited in claim 6, wherein the via plugs have a height of 90% to 100% of a height of the vias.

11. A method of forming a damascene structure in a low-k dielectric layer, comprising the steps of:
   etching a plurality of vias in the low-k dielectric layer;
   forming via plugs in the plurality of vias;
   providing a poison free trench pattern over the low-k dielectric, in which said plurality of vias were previously etched, wherein the poison free trench pattern is provided by making the low-k dielectric layer nitrogen free and providing a nitrogen free ARL and barrier dielectric;
   etching a plurality of trenches into the low-k dielectric layer, wherein the etching removes fences caused by the via plugs and minimizes faceting, wherein the etching the plurality of trenches, comprises:
      etching with a first etchant gas which comprises a polymerized mixture to form fence formations around the via plugs; and
      etching with a second etchant gas subsequent to etching with the first etchant gas, wherein the second etchant gas comprises a lower polymerizing mixture, which etches away the fence formations; and
   stripping the via plugs.

12. The method, as recited in claim 11, wherein the via plugs have a height of 75% to 100% of a height of the vias.

13. The method, as recited in claim 11, wherein the via plugs have a height of 90% to 100% of a height of the vias.

* * * * *